United States Patent
Ushikawa

[19]

[11] Patent Number: 6,140,256
[45] Date of Patent: Oct. 31, 2000

[54] METHOD AND DEVICE FOR TREATING SEMICONDUCTOR WITH TREATING GAS WHILE SUBSTRATE IS HEATED

[75] Inventor: Harunori Ushikawa, Sagamihara, Japan

[73] Assignee: Tokyo Electron Limited, Tokyo, Japan

[21] Appl. No.: 09/068,975

[22] PCT Filed: Nov. 25, 1996

[86] PCT No.: PCT/JP96/03445

§ 371 Date: May 22, 1998

§ 102(e) Date: May 22, 1998

[87] PCT Pub. No.: WO97/20340

PCT Pub. Date: Jun. 5, 1997

[30] Foreign Application Priority Data

Nov. 28, 1995 [JP] Japan .................................. 7-334076
Jul. 19, 1996 [JP] Japan .................................. 8-209018

[51] Int. Cl.[7] .............................................. H01L 21/324
[52] U.S. Cl. ............................................ 438/795; 432/121
[58] Field of Search ............................. 29/25.01, 25.02; 438/795, 796, 797, 798, 799; 432/120, 121, 122, 126, 147

[56] References Cited

U.S. PATENT DOCUMENTS

| Re. 34,910 | 4/1995 | Funkenbusch et al. | 210/198.2 |
|---|---|---|---|
| 3,771,948 | 11/1973 | Matsumiya | 432/122 |
| 4,507,078 | 3/1985 | Tam et al. | 432/11 |
| 5,228,501 | 7/1993 | Tepman et al. | 165/80.1 |
| 5,431,700 | 7/1995 | Sloan | 29/25.01 |
| 5,674,632 | 10/1997 | Ahern et al. | 428/612 |
| 5,697,427 | 12/1997 | Ngan et al. | 165/80.1 |
| 5,817,156 | 10/1998 | Tateyama et al. | 29/25.01 |
| 5,872,889 | 2/1999 | Kaltenbrunner et al. | 392/418 |
| 5,885,353 | 3/1999 | Stodtbeck et al. | 118/712 |
| 5,941,083 | 8/1999 | Sada et al. | 62/99 |

OTHER PUBLICATIONS

S. Wolf and R. N. Tauber, Silicon Processing for the VLSI Era, vol. 1 –Process Technology, pp. 161–162, 1986.

*Primary Examiner*—Matthew Smith
*Assistant Examiner*—Robert A. Hullinger
*Attorney, Agent, or Firm*—Oblon, Spivak, McClelland, Maier & Neustadt, P.C.

[57] ABSTRACT

A CVD apparatus for processing semiconductor wafers (W) one by one has a process chamber (2) and a worktable (3). A resistance heating wire (31) is embedded in the worktable such that the upper surface of the worktable functions as a mount surface (3a) for mounting a wafer. The worktable is provided therein with first support means (4) having three vertical lifter pins (41, 42, 43) and second support means (5) having three vertical lifter pins (51, 52, 53). The wafer is moved down from a transfer position to the mount surface by the second support means. The wafer is heated on the mount surface up to a process temperature by contact heating, then is moved by the first support means up to a process position where it is slightly floated above the mount surface. The wafer is heated at the process position and kept at the process temperature by non-contact heating with radiation heat from the mount surface. In this state, a process gas is supplied and a polysilicon film is formed on the wafer.

14 Claims, 5 Drawing Sheets

METHOD AND DEVICE FOR TREATING SEMICONDUCTOR WITH TREATING GAS WHILE SUBSTRATE IS HEATED

TECHNICAL FIELD

The present invention relates to a semiconductor processing method, such as CVD (Chemical Vapor Deposition) or diffusion, in which a process gas is used while a target substrate is heated, and an apparatus for the method. The term, semiconductor processing, used herein includes various kinds of processes which are performed to manufacture a semiconductor device on a target substrate, such as a semiconductor wafer or an LCD substrate.

BACKGROUND ART

In order to manufacture a semiconductor device on a target substrate, such as a semiconductor wafer or an LCD substrate, film formation by deposition, such as CVD, or film formation by diffusion, such as thermal oxidation is utilized. In such semiconductor processes, a process gas is supplied while the target substrate is heated, so that a predetermined process is performed.

For example, a conventional CVD apparatus for processing semiconductor wafers one by one employs a heating body, such as a ceramic heater, incorporated in a worktable arranged in a process chamber. A plurality of lifter pins are also incorporated in the worktable, for moving each wafer up and down relative to the worktable. A shower head is disposed above the worktable, for supplying a process gas.

One wafer is transferred onto the lifter pins by a transfer arm, and mounted on the worktable by the lifter pins moving down. Then, the wafer mounted on the worktable is heated by the heating body to a predetermined process temperature. In this state, the process gas is supplied while the process chamber is exhausted, so that a thin film is formed on the wafer by deposition.

However, in the above described conventional apparatus, a certain temperature distribution is generated on the mount surface of the worktable such that it corresponds to the wiring pattern of a resistance heating wire in the ceramic heater used as the heating body. The wafer copies the temperature distribution pattern formed on the mount surface, thereby causing an unevenness in its temperature. As a result, a decrease is brought about in planar uniformity of the thickness and quality of the formed thin film.

Further, in the above described conventional apparatus, the thin film is formed continuously from the peripheral edge of the wafer to the surface of the worktable. When the wafer is pushed up from the worktable after the thin film is formed, the thin film is peeled off between the wafer W and the worktable, and generates particles.

Jpn. U.M. Appln. KOKAI Publication No. 5-33535 discloses a CVD apparatus having a susceptor provided with a plurality of pins, on which a wafer is mounted while a thin film is formed. This apparatus entails a decrease in processing efficiency and a decrease in utility efficiency of processing energy, because the wafer is indirectly heated.

DISCLOSURE OF INVENTION

Therefore, in a semiconductor processing method and apparatus in which a process gas is used while a target substrate is heated, it is an object of the present invention to improve planar uniformity in a process applied to the target substrate, while limiting a decrease in processing efficiency and a decrease in utility efficiency of processing energy.

According to a first aspect of the present invention, there is provided a semiconductor processing method comprising:
- a loading step of loading a target substrate into a process chamber, and mounting the target substrate onto a mount surface of a worktable, the mount surface being arranged to be heated by a heating member;
- a contact heating step of heating the target substrate substantially to a process temperature by the mount surface, while maintaining a state where a bottom surface of the target substrate is in contact with the mount surface;
- a separating step, following the contact heating step, of separating the target substrate and the mount surface from each other while keeping them parallel to each other, so as to transfer to a non-contact state where the bottom surface of the target substrate and the mount surface face each other with a first gap therebetween, the bottom surface of the target substrate being substantially entirely exposed to radiation heat from the mount surface to heat the target substrate in the separating step;
- a non-contact heating step of causing the bottom surface of the target substrate to be substantially entirely exposed to radiation heat from the mount surface in the non-contact state to heat the target substrate and keep the target substrate substantially at the process temperature; and
- a main processing step of supplying a process gas into the process chamber while performing the non-contact heating step, and subjecting the target substrate to a main process using the process gas.

According to a second aspect of the present invention, there is provided a semiconductor processing apparatus comprising:
- (a) a process chamber for housing a target substrate;
- (b) a worktable arranged in the process chamber and having a mount surface for mounting and heating the target substrate;
- (c) a heating member for heating the mount surface;
- (d) separating means for separating the target substrate and the mount surface from each other while keeping them parallel to each other and substantially entirely exposing the bottom surface of the target substrate, so as to transfer from a state where the bottom surface of the target substrate and the mount surface are in contact with each other to a non-contact state where the bottom surface of the target substrate and the mount surface face each other with a first gap therebetween;
- (e) gas supply means for supplying a process gas into the process chamber; and
- (f) control means for controlling the heating member, the separating means, and the gas supply means, the control means being set to perform the semiconductor processing method of the first aspect.

According to the present invention, it is possible to cause a temperature distribution on the worktable to less influence the target substrate, so that a process is performed with a high planar uniformity. Further, where a film formation process of, for example, polysilicon is performed, a thin film can be also formed on the bottom surface of the target substrate.

BEST MODE OF CARRYING OUT THE INVENTION

Figure 1:
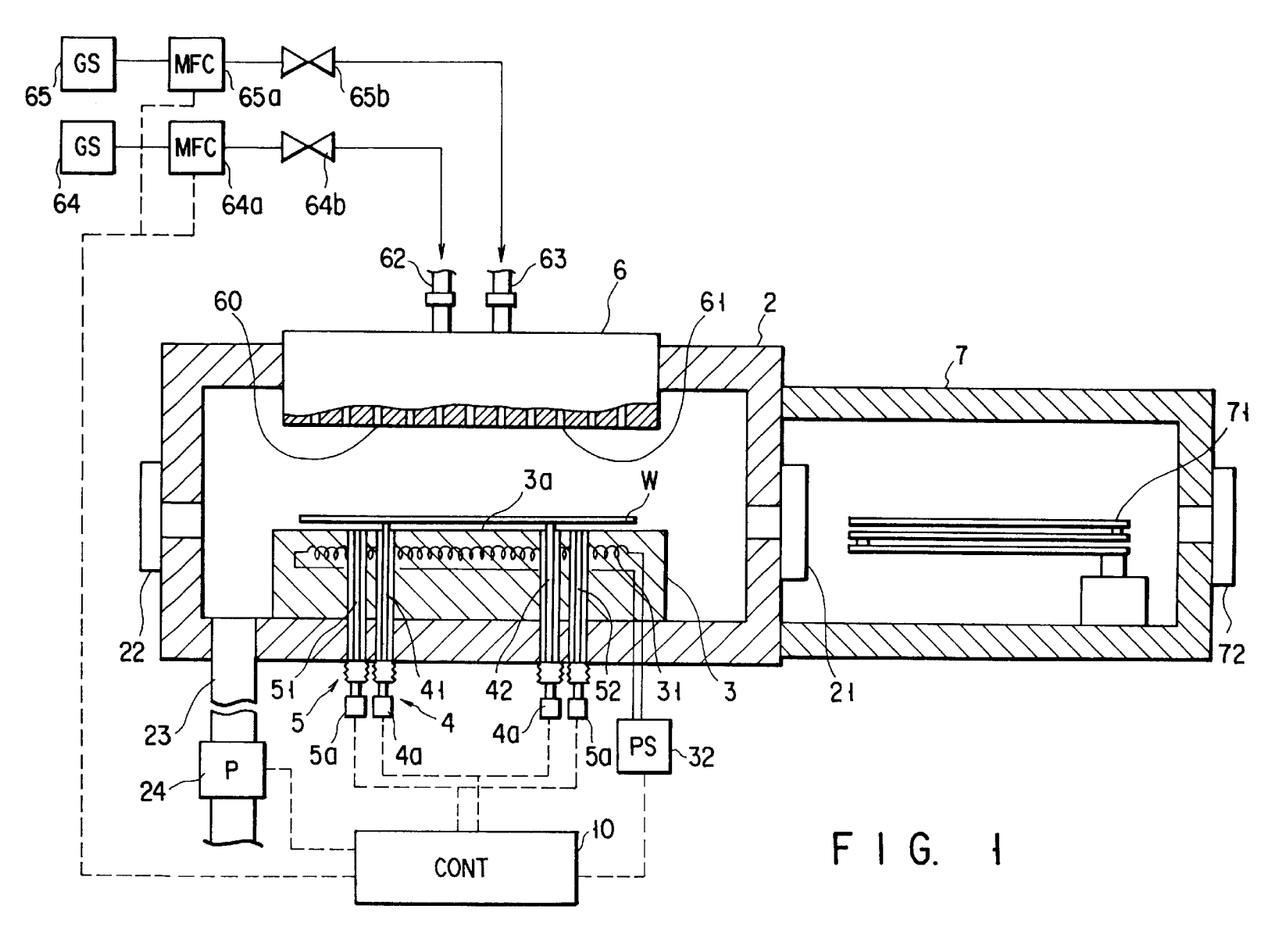
FIG. 1 is a cross-sectional view showing a semiconductor processing apparatus according to an embodiment of the present invention.

As shown in FIG. 1, a CVD apparatus according to an embodiment is designed to process semiconductor wafers one by one. The apparatus has an airtight process chamber 2 for housing a target substrate. An exhaust pipe 23 provided with a vacuum pump 24 is connected the bottom of the processing chamber 2. The vacuum pump 24 is controlled by a control section 10. The process chamber 2 can be set at a predetermined vacuum atmosphere, such as about 10 Torr, by the vacuum pump 24 under control of the control section 10.

Figure 3:
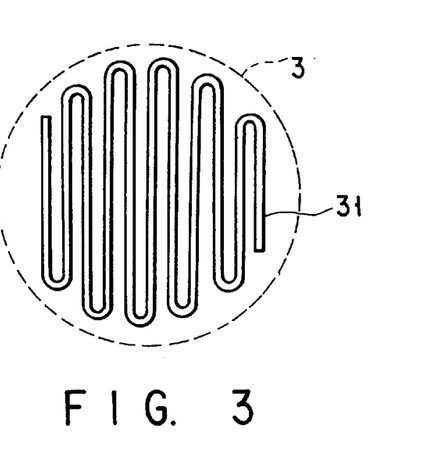
FIG. 3 is a perspective view showing the worktable of the apparatus shown in FIG. 1.

A worktable 3 having the shape of, for example, a circular column, is arranged on the central portion of the bottom of the process chamber 2, and contains a heating body. The top surface of the worktable 3 is formed as a flat mount surface 3a for mounting and heating a wafer W. For example, the worktable 3 is formed as a ceramic heater such that a resistance heating wire 31 having a pattern shown in FIG. 3 is arranged in a ceramic body. The ceramic body consists an insulating and opaque solid layer, in which the resistance heating wire 31 is embedded.

The resistance heating wire 31 is connected to a power supply 32 disposed outside the process chamber 2. The power supply 32 is controlled by the control section 10. The mount surface 3a can be heated to an arbitrary temperature by the resistance heating wire 31 under control of the control section 10.

Figure 2:
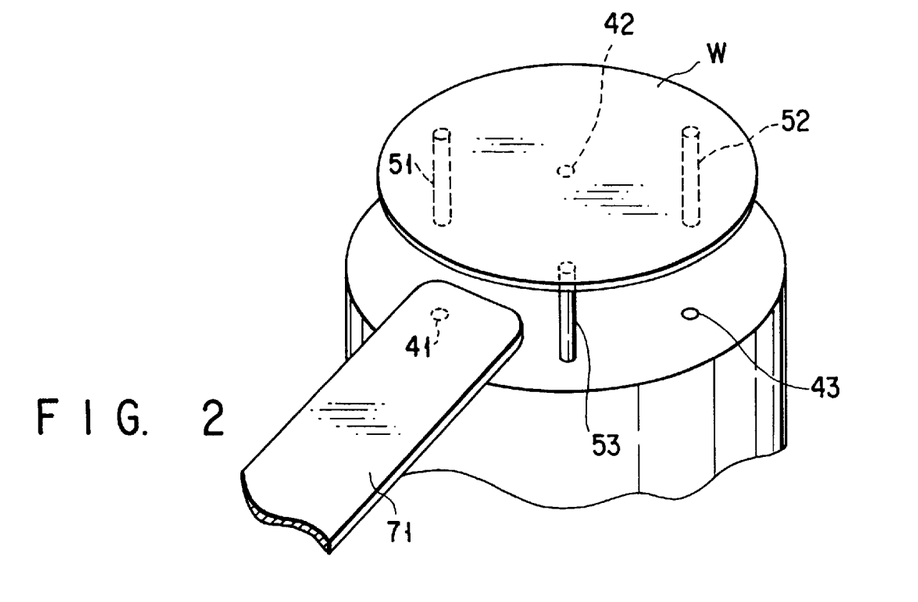
FIG. 2 is a plan view showing the wiring pattern of a resistance heating wire arranged in a worktable employed in the apparatus shown in FIG. 1.

In the worktable 3, there are first support means 4 having at least three vertical lifter pins 41, 42, and 43, and second support means 5 having at least three vertical lifter pins 51, 52, and 53. As shown in FIG. 2, the first and second support means 4 and 5 are arranged such that the two groups of pins are alternately disposed at six positions, respectively, which equidistantly divide the mount surface 3a of the worktable 3 in an angular direction. The wafer W can be mounted such that its bottom surface is supported at three points on the top portions of the lifter pins 41, 42, and 43, or the lifter pins 51, 52, and 53.

The lifter pins 41, 42, and 43 of the first support means 4 are simultaneously driven by a corresponding air cylinder 4a, so that they are moved up and down vertically between a state where they project from the mount surface 3a and a state where they retreat under the mount surface 3a. On the other hand, the lifter pins 51, 52, and 53 of the second support means 5 are simultaneously driven by a corresponding air cylinder 5a, so that they are moved up and down vertically between a state where they project from the mount surface 3a and a state where they retreat under the mount surface 3a. The air cylinders 4a and 5a of the first and second support means 4 and 5 are controlled by the controller 10.

When these lifter pins are being driven, a plane defined by the top portions of the lifter pins 41, 42 and 43, and a plane defined by the top portions of the lifter pins 51, 52 and 53 are always kept parallel to the mount surface 3a of the worktable 3. In other words, the wafer W is moved up and down by the first and second support means 4 and 5 while it is kept parallel to the mount surface 3a.

The first and second support means 4 and 5 are designed such that the projecting positions of the tip portions differ from each other. When the first support means 4 is in the projecting state, it supports the wafer W at a process position for subjecting the wafer W to non-contact heating. On the other hand, when the second support means 5 is in the projecting state, it supports the wafer W at a transfer position for transferring the wafer W to and from a transfer arm described later. The process position is interposed between the transfer position and the mount surface 3a. For example, at the transfer position, the bottom surface of the wafer W is floated above the mount surface 3a by a distance of from 4 mm to 10 mm, preferably of from 4 mm to 5 mm. At the process position, the bottom surface of the wafer W is floated above the mount surface 3a by a distance of not more than 5 mm, preferably of from 0.5 mm to 2 mm.

Figure 4:
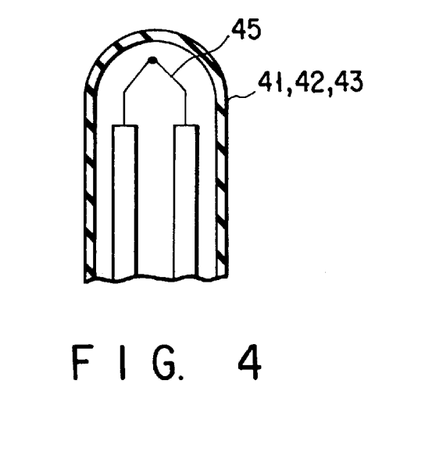
FIG. 4 is a cross-sectional view showing the tip portion of a lifter pin incorporated in the worktable of the apparatus shown in FIG. 1.

As shown in FIG. 4, the terminal of temperature measuring means, such as a thermocouple 45 is arranged in the tip portion of each of the lifter pins 41, 42, and 43 of the first support means 4. The temperature of the wafer W is monitored by the control section 10 through the thermocouple 45, while the wafer W is mounted on the lifter pins 41, 42, and 43.

Gas supply means 6 is connected to the process chamber 2, for supplying a process gas into the process chamber 2. The gas supply means 6 has a shower head 60 arranged at the upper portion of the process chamber 2 to face the worktable 3. The bottom surface of the shower head 60 is parallel to the mount surface 3a, and a number of gas spouting holes 61 are open on the bottom surface. The gas spouting holes 61 are arranged to face the entirety of the wafer W.

The shower head 60 is connected through gas supply tubes 62 and 63 to gas sources 64 and 65, which contain different gases, such as monosilane gas ($SiH_4$) and phosphine gas ($PH_3$), respectively. The gases supplied through the gas supply tubes 62 and 63 are spouted from different holes of the gas spouting holes 61. The gas supply tubes 62 and 63 are provided with mass-flow controllers 64a and 65a, and valves 64b and 65b, respectively. The mass-flow controllers 64a and 65a are controlled by the control section 10.

A pair of load lock chambers are arranged adjacent to the process chamber 2 on the inlet and outlet sides (only the load lock chamber 7 on the inlet side is shown in the drawings). Both of the wafer passages between the process chamber 2 and the load lock chambers are airtightly closed and opened by gate valves 21 and 22. The load lock chamber 7 on the inlet side is provided with a transfer arm 71 therein, for transferring the wafer W. Similarly, the load lock chamber on the outlet side is also provided with a transfer arm 73 therein (see FIG. 6E).

An explanation will be given, with reference to FIGS. 6A to 6E, on a semiconductor processing method performed under control of the control section 10 in the apparatus shown in FIG. 1. This method is exemplified by a process of forming a phosphorus-doped polysilicon film on an Si wafer entirely covered with $SiO_2$ film, while using monosilane gas ($SiH_4$) and phosphine gas ($PH_3$) as process gases (film formation gases).

Figure 6A:
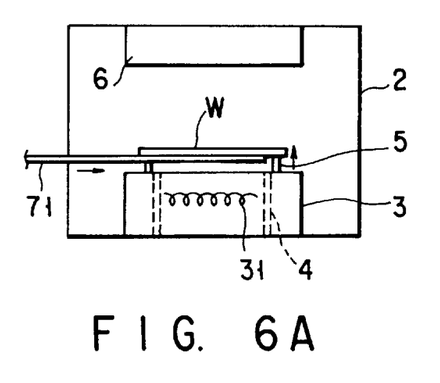
FIGS. 6A to 6E are cross-sectional views showing the steps, in order, of a film formation method, using the apparatus shown in FIG. 1.

First, as shown in FIG. 6A, a wafer W is transferred by the transfer arm 71 from the load lock chamber 7 into the process chamber 2. Then, the wafer W is delivered from the transfer arm 71 onto the second support means 5 at the transfer position. Accordingly, at this time, the lifter pins 51, 52, and 53 of the second support means 5 project from the mount surface 3a.

Figure 6B:
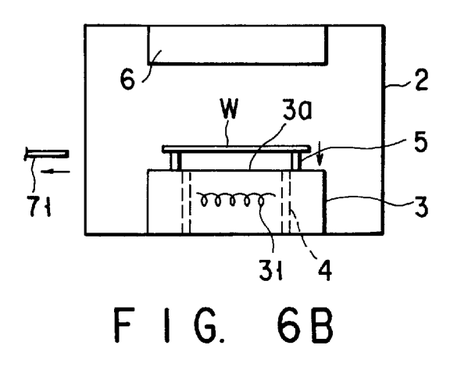
Figure 6C:
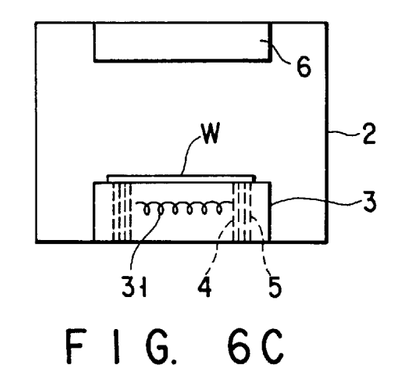

Then, as shown in FIG. 6B, the transfer arm 71 is retreated into the load lock chamber 7, and the gate valve 21 on the load lock chamber 7 side is closed to cause the process chamber 2 to be in an airtight state. At the same time, the second support means 5 is moved down, and the wafer W is mounted on the mount surface 3a of the worktable 3, as shown in FIG. 6C. The transfer of the wafer W from the load lock chamber 7 onto the mount surface 3a can be performed in, for example, about 15 seconds.

The wafer W is heated substantially to a process temperature, e.g., about 640° C. by means of heat conduction from the resistance heating wire 31 through the mount surface 3a, while the bottom surface of the wafer W is in plane-contact with the mount surface 3a of the worktable 3, as shown in FIG. 6C. This heating-up from room temperature to about 640° C. by the plane-contact heating can be performed in, for example, about 60 seconds. Note that, in the step of heating substantially up to the process temperature by the plane-contact heating, it is preferable to cause the heating to reach the process temperature or to go beyond it by several degrees °C. However, the heating substantially up to the process temperature by the plane-contact heating also includes a case where the heating is performed to a temperature lower than the process temperature by several degrees °C.

Figure 6D:
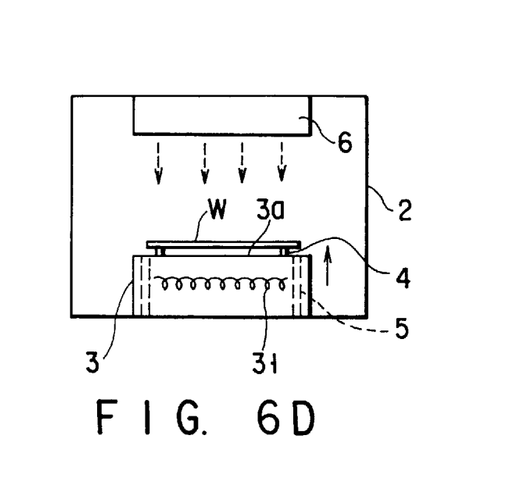

Then, the wafer W and the mount surface 3a are separated from each other while they are kept parallel to each other, as shown in FIG. 6D. Specifically, the lifter pins 41, 42, and 43 of the first support means 4 are caused to project from the mount surface 3a, and the wafer W is lifted up from the mount surface 3a to the process position. At the process position, the bottom surface of the wafer W is out of contact with the mount surface 3a with a gap of about from 0.5 mm to 2 mm therebetween.

While the wafer W is moved up and placed at the process position by the first support means 4, the bottom surface of the wafer W is kept parallel to the mount surface 3a. Since the lifter pins 41, 42, and 43 are in contact with the bottom surface of the wafer W only at three points, while the wafer W is moved up and placed at the process position by them, the substantial entirety of the bottom surface of the wafer W is exposed to radiation heat from the mount surface 3a to heat the wafer W by non-contact heating. As a result, the wafer W can be heated and kept substantially at the process temperature, e.g., about 640° C.

Note that, since the distance between the wafer W and the mount surface 3a in the process position is small, the temperature of the wafer W can be kept substantially at the process temperature by the non-contact heating, without adjusting the temperature of the mount surface 3a by changing the heating rate of the resistance heating wire 31. However, where the temperature difference of the wafer W between the contact heating and the non-contact heating is large, the temperature of the mount surface 3a may be adjusted. In this case, in the apparatus shown in FIG. 1, it is possible to monitor the temperature of the wafer W through the temperature measuring terminals 45 arranged in the tip portions of the pins 41, 42, and 43 of the first support means 4, and to feed-back-control the heating rate of the resistance heating wire 31, by the control section 10.

As shown in FIG. 6D, CVD film formation is performed while the wafer W placed at the process position is heated and kept at about 640° C. by the non-contact heating with the radiation heat from the mount surface 3a. Specifically, $SiH_4$ gas and $PH_3$ gas are supplied by the gas supply means 6 into the process chamber 2, and a phosphorus-doped polysilicon film is formed on the wafer W. At this time, the $SiH_4$ and $PH_3$ gases are supplied at flow rates of, for example, 200 cc/min and 10 cc/min, respectively. Supply of these process gases into the process chamber 2 is started at a timing simultaneous to when the bottom surface of the wafer W is separated from the mount surface 3a, or at a timing simultaneous to when the wafer W is placed at the process position. The CVD film formation is applied to the wafer W for about 120 seconds with the process gases flowing.

The process gases are introduced while the process chamber 2 is exhausted by the exhaust pump 24, so that the process chamber 2 is kept at a pressure of about 10 Torr during the film formation. The vacuum exhaustion of the process chamber 2 by the exhaust pump 24 can be started immediately after the transfer arm 71 is retreated and the gate valve 21 is closed, as shown in FIG. 6B.

After the film formation, the supply of the process gases is stopped, and an inactive gas, such as nitrogen gas, is supplied into the process chamber 2. The wafer W is supported at the process position by the first support means 4 until the inside of the process chamber 2 is displaced by the inactive gas. This purge step by the inactive gas can be performed in about 60 seconds.

Figure 6E:
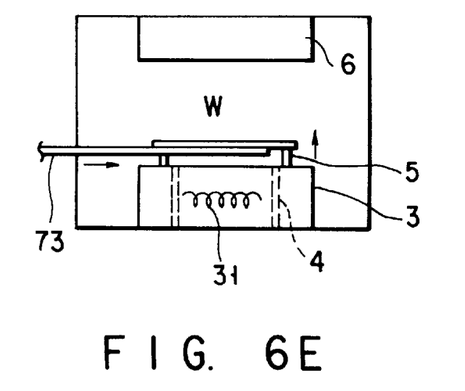

Then, as shown in FIG. 6E, the second support means 5 is moved up to receive the wafer W from the first support means 4 and further lift the wafer W up to the transfer position. After the wafer W is received by the second support means 5, the first support means 4 is retreated under the mount surface 3a.

Then, the wafer W placed at the transfer position is received by the transfer arm 73 on the outlet side. The wafer W is transferred by the transfer arm 73 from the process chamber 2 into the load lock chamber on the outlet side.

In the semiconductor processing method described above, the step of heating the wafer W up to the process temperature, after the wafer W is transferred into the process chamber 2, is performed by the contact heating in which the bottom surface of the wafer W is in plane-contact with the mount surface 3a. Consequently, the wafer W is heated by means of heat conduction from the mount surface 3a to reach the process temperature quickly. Where the wafer W is heated while the wafer W is out of contact with the worktable 3, its temperature rising rate becomes low. In an experiment, the wafer W was heated up to about 640° C., faster by about 30 seconds on the mount surface 3a than at the process position.

On the other hand, the wafer W is subjected to the film formation process at the process position where the wafer W is slightly floated above the mount surface 3a. The process position is arranged lower than the transfer position where the wafer W is transferred between the second support means 5 and the transfer arm 71. The wafer W is heated at the process position with radiation heat from the mount surface 3a, in the non-contact state during the film formation. As a result, planar non-uniformity in the temperature of the mount surface 3a caused due to the shape of the resistance heating wire 31 and copied on the wafer during the contact heating is solved by the non-contact heating. It follows that the temperature of the wafer can have a better planar uniformity than that in a case where a film formation is performed while the bottom surface of a wafer W is in contact with the mount surface 3a. In other words, the thickness of a film thus formed can have a high planar uniformity.

Since the film formation is performed while the wafer W is floated above the worktable 3, no continuous thin film is formed to extend from the peripheral edge of the wafer W to the top surface of the worktable 3. As a result, particles are prevented from being produced due to peeling-off of the continuous thin film, when the wafer W is lifted up by the second support means 5 from the worktable 3.

Figure 5:
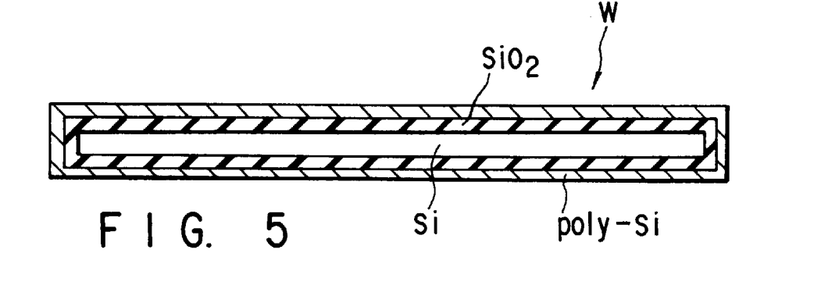
FIG. 5 is a cross-sectional view showing an Si wafer which is provided with a polysilicon film formed by a method according to an embodiment of the present invention.

Further, since the process is performed while the wafer W is floated above the worktable 3, the process gases can flow from the peripheral edge of the wafer W into a position on its bottom surface. Accordingly, a polysilicon film is formed on the bottom surface of the wafer W as well as its top surface and peripheral edge. The polysilicon film is formed on the bottom surface of the wafer W even at the central portion, though its thickness is smaller than that at the peripheral portion. In other words, as shown in FIG. 5, the polysilicon film is formed all over the $SiO_2$ film of the wafer W, such that the entire surface of the wafer W is covered by the polysilicon film.

The polysilicon film thus formed on the bottom surface of the wafer W with a certain thickness can present a gettering effect.

Where another film is further formed on the polysilicon film, a native oxide film is removed generally by washing it with hydrofluoric acid (HF) solution before the other film is formed. If the polysilicon film has a certain thickness, the polysilicon film on the bottom surface of the wafer W is not broken by the invading hydrofluoric acid solution, when the washing treatment with the hydrofluoric acid solution is performed in this next step. Accordingly, the native oxide film is removed by the hydrofluoric acid solution while the wafer W is protected by the polysilicon film.

In contrast, where a polysilicon film is formed on the $SiO_2$ film by a conventional CVD apparatus of a contact-heating type, which processes wafers one by one, it is difficult to perform an HF washing treatment in the next step. Specifically, in this case, a film is formed on the bottom surface of the wafer W with a film formation gas which has entered an interstice between the worktable and the wafer W. However, the amount of film formation gas which can enter the interstice is very small. Consequently, a polysilicon film is hardly formed all over the bottom surface of the wafer W, or even if the polysilicon film is formed, it becomes very thin at the central portion on the bottom surface of the wafer W.

In other words, where a polysilicon film is formed by the conventional CVD apparatus of a contact-heating type, which processes wafers one by one, the polysilicon film on the bottom surface is broken by the hydrofluoric acid solution and allows the solution to come into contact with the inside $SiO_2$ film. Since the $SiO_2$ film cannot withstand the hydrofluoric acid solution, the $SiO_2$ film is also broken and allows the solution to enter the broken gap. The hydrofluoric acid solution then flows through the interface between the $SiO_2$ film and Si on the surface of the wafer, and separates the $SiO_2$ film from the Si. As a result, the $SiO_2$ film is peeled off along with the polysilicon film, over positions from the bottom surface to the top surface.

In the present invention, the process position for the wafer W is decided such that the bottom surface of the wafer W is floated above the mount surface 3a by a small gap. The thickness of the gap is set at not more than 5 mm, preferably from 0.5 mm to 2 mm. Where the gap is smaller than this range, a thin film may be formed to extend from the outer edge of the wafer W to the mount surface 3a. In contrast, where the gap is larger than this range, the difference between the temperatures in the contact heating and the non-contact heating becomes large, thereby causing the temperature of the wafer W to be hardly controlled, as well as bringing about a waste of energy generated by the resistance heating wire 31.

FIGS. 7A to 7E are cross-sectional views showing the steps, in order, of a film formation method, using a semiconductor processing apparatus according to another embodiment. The apparatus according to this embodiment differs from the apparatus shown in FIG. 1, in that it is equipped with no second support means 5, but with a first support means 4 having two projecting states to support the wafer W at the transfer position and the process position. The two projecting states of the first support means 4 are obtained by controlling an air cylinder 4a by a control section 10. In this case, the driving source of the first support means 4 may be formed of a ball screw mechanism instead of the air cylinder 4.

A film formation method according to this embodiment is the same as the method shown in FIGS. 6A to 6E except that the first support means 4 also performs the function of the second support means 5. Therefore, a brief explanation will be given on this film formation method with reference to FIGS. 7A to 7E.

Figure 7A:
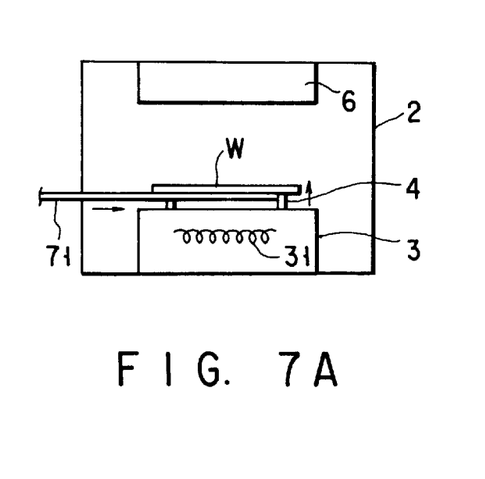
FIGS. 7A to 7E are cross-sectional views showing the steps, in order, of a film formation method, using a semiconductor processing apparatus according to another embodiment.

First, as shown in FIG. 7A, a wafer W is delivered from the transfer arm 71 onto the first support means 4 at the transfer position.

Figure 7B:
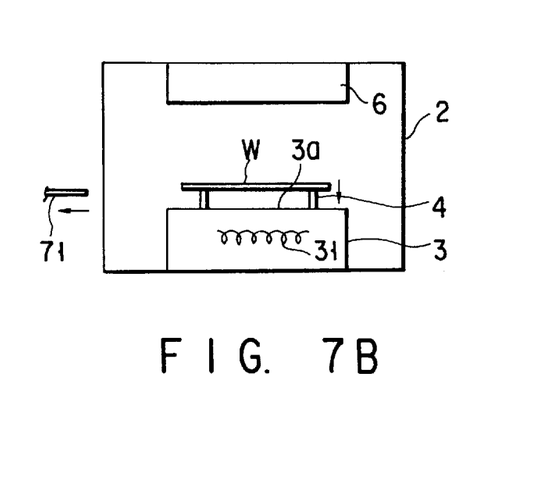
Figure 7C:
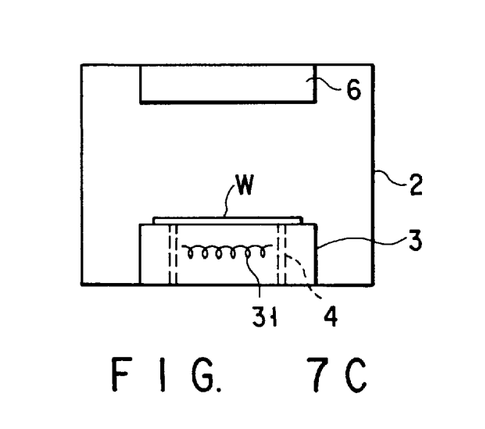

Then, as shown in FIG. 7B, the first support means 4 is moved down, and the wafer W is mounted on the mount surface 3a of the worktable 3, as shown in FIG. 7C.

Then, the wafer W is heated up to a process temperature by contact heating through the mount surface 3a.

Figure 7D:
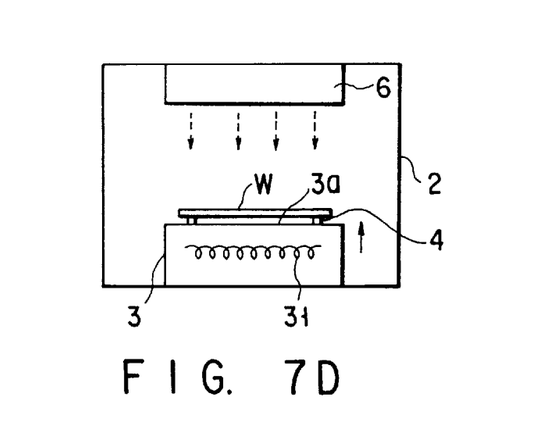

Then, the first support means 4 is moved up to lift the wafer w up to the process position. At this position, as shown in FIG. 7D, a film formation is performed while the wafer W is heated by non-contact heating with radiation heat from the mount surface 3a, and process gases are supplied.

Then, an inactive gas, such as nitrogen gas, is supplied into the process chamber 2, so that the inside of the process chamber 2 is displaced by the inactive gas. During this purge step, the wafer W is held at the process position.

Figure 7E:
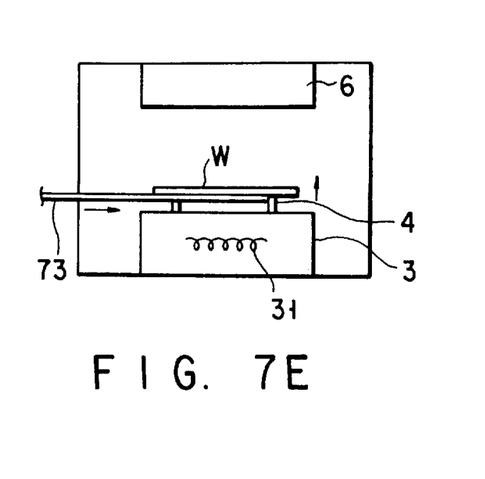

Then, the first support means 4 is further moved up to lift the wafer W up to the transfer position. Then, as shown in FIG. 7E, the wafer W is received and transferred out of the process chamber 2 by the transfer arm 73.

In the semiconductor processing method described above, the same effects as in the method shown in FIGS. 6A to 6E can be obtained. Further, since the second support means 5 is omitted, the apparatus has a simple structure.

Figure 8:
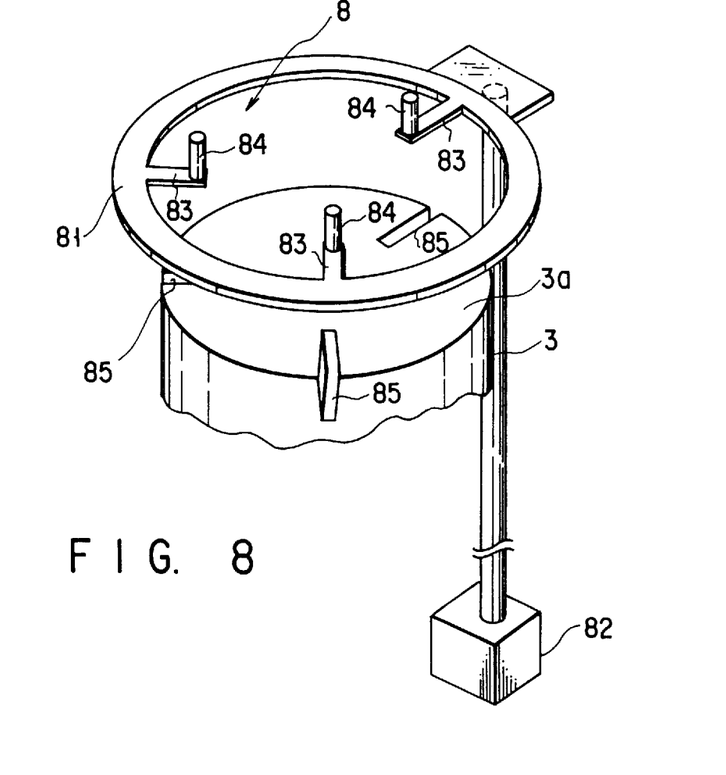
FIG. 8 is a perspective view showing the main part of a semiconductor processing apparatus according to still another embodiment.

FIG. 8 is a perspective view showing the main part of a semiconductor processing apparatus according to still another embodiment.

Similar to the embodiment shown in FIGS. 7A to 7E, this embodiment has a structure equipped with one support means 8 having two projecting states to support the wafer W at the transfer position and the process position. The support means 8 has a ring 81, which is moved up and down by an elevating mechanism 82. The ring 81 has, for example, three beams 83 horizontally extending inward therefrom, which are provided with vertically extending pins 84 at their distal ends, respectively.

The mount surface 3a of a worktable 3 is provided with grooves 85 to correspond to the beams 83. When the ring 81 is moved down to cause the beams 83 to enter the grooves 85, the tip portions of the pins 84 are retreated down from the mount surface 3a. The two projecting states, where the tip portions of the pins 84 are projected from the mount surface 3a, correspond to states for supporting the wafer W at the transfer position and the process position, respectively.

An explanation will be given on experiments, using the apparatus shown in FIG. 1. In the experiments, comparison was conducted in terms of the thickness of polysilicon films formed on the bottom surfaces of wafers W, in a case where a film formation process was performed on a wafer W floated above the mount surface 3a and a case where a film formation process was performed on a wafer W mounted on the mount surface 3a. In each film formation process, $SiH_4$, $PH_3$, $N_2$, and $BN_2$ gases were supplied at flow rates of 400 cc/min, 32 cc/min, 568 cc/min, and 500 cc/min, respectively, while the inside of the process chamber was kept at a pressure of 1000 Pa and each wafer W was heated at a temperature of 640° C. Under these conditions, a phosphorus-doped polysilicon film having a thickness of 111 nm was formed on the top surface of the wafer W.

Figure 9A:
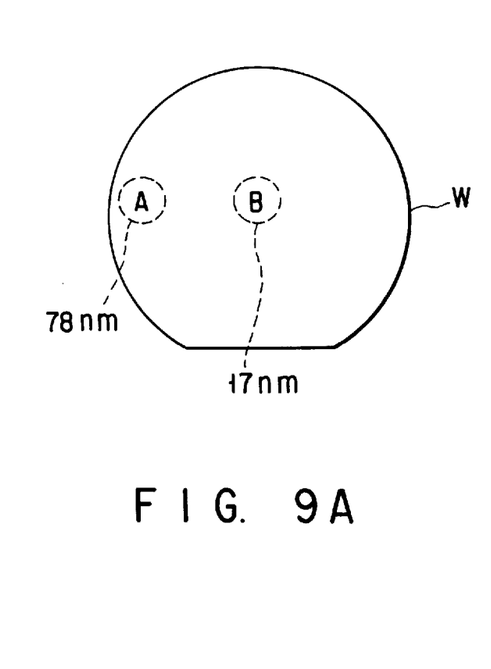
FIGS. 9A and 9B are explanatory views explaining experiments of measuring the thickness of polysilicon films formed on the bottom surfaces of wafers.
Figure 9B:
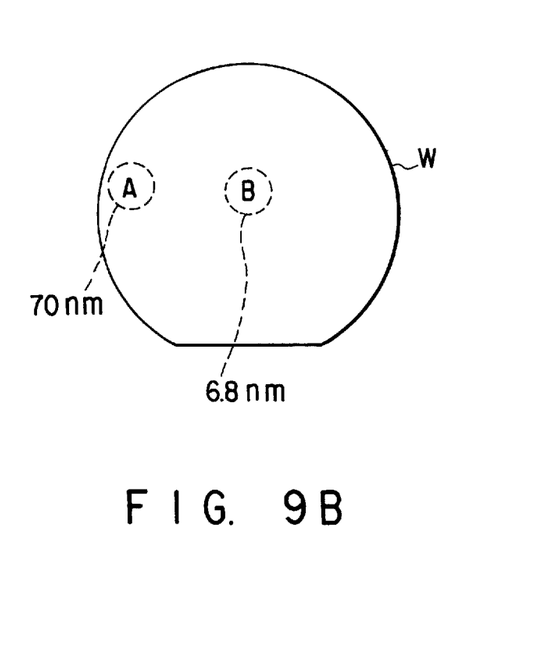

After the film formation process, the thickness of the polysilicon film was measured at a position A in the peripheral portion and a position B in the central portion on the bottom surface of the wafer W, as shown in FIGS. 9A and 9B. As a result, the thickness was 78 nm and 17 nm at the positions A and B, respectively, as shown in FIG. 9A, in the case where the wafer W was floated. On the other hand, the thickness was 70 nm and 6.8 nm at the positions A and B, respectively, as shown in FIG. 9B, in the case where the wafer W was mounted. Further, the wafer W shown in FIG. 9A, which had been processed in the floated state, was subjected to a washing treatment with 0.5% hydrofluoric acid solution. In this case, the washing treatment was performed without causing the polysilicon film to peel off.

As described above, the present invention may be applied to various CVD processes in which a thin film is formed by depositing a material on a target substrate, while the material is provided by thermal dissociation of a process gas. For example, another one of the CVD processes is a process of forming a silicon nitride film ($Si_3N_4$), using dichlorosilane ($SiH_2Cl_2$) and ammonia ($NH_3$).

The present invention may be applied to diffusion processes in which a film is formed by diffusing a material in a surface layer of a target substrate, or by causing the diffusion material to react with the surface layer, while the material is provided by thermal dissociation of a process gas. For example, one of the diffusion processes is an oxidation process in which oxygen is thermally diffused in an Si wafer to entirely cover the Si wafer with an $SiO_2$ film. Since the surface temperature of the wafer works as a rate-limiting factor in the oxidation process, planar uniformity of the oxide film is improved by increasing planar uniformity in the temperature of the wafer.

The oxidation process can be performed in accordance with steps the same as those shown in FIGS. 6A to 6E or FIGS. 7A to 7E, except that oxygen gas or steam is supplied as a process gas from the gas supply means 6. Note that the temperature of the wafer in the oxidation process is generally set at a temperature of from 1000° C. to 1100° C. in dry oxidation, and of from 900° C. to 1000° C. in wet oxidation.

Furthermore, the present invention may be applied to an ashing process of entirely etching a resist layer on a target substrate, or an annealing process of heat-treating a target substrate while causing a nitrogen gas or hydrogen gas to flow.

What is claimed is:

1. A semiconductor processing method comprising:
    a loading step of loading a target substrate into a process chamber, and mounting said target substrate onto a mount surface of a worktable, said mount surface being arranged to be heated by a heating member;
    a contact heating step of heating said target substrate substantially to a process temperature by said mount surface, while maintaining a state where a bottom surface of said target substrate is in contact with said mount surface;
    a separating step, following said contact heating step, of separating said target substrate and said mount surface from each other while keeping them parallel to each other, so as to transfer to a non-contact state where said bottom surface of said target substrate and said mount surface face each other with a first gap therebetween, said bottom surface of said target substrate being substantially entirely exposed to radiation heat from said mount surface to heat said target substrate in said separating step;
    a non-contact heating step of causing said bottom surface of said target substrate to be substantially entirely exposed to radiation heat from said mount surface in said non-contact state to heat said target substrate and keep said target substrate substantially at said process temperature; and
    a main processing step of supplying a process gas into said process chamber while performing said non-contact heating step, and subjecting said target substrate to a main process using said process gas,
        wherein said steps from said contact heating step to said main processing step are performed under a control of a control section,
        wherein said non-contact state is formed in said separating step by moving said target substrate up to a process position while keeping said mount surface stationary,
        wherein said target substrate is moved up in said separating step by a first support member, which is movable up and down, while said target substrate is mounted on said first support member such that said bottom surface is substantially entirely exposed,
        wherein said first support member is arranged to be in contact with said bottom surface of said target substrate in at least three positions,
        wherein said first support member comprises not less than three lifter pins, which are movable up and down between a state where they project from said mount surface and a state where they retreat under said mount surface.

2. The method according to claim 1, wherein said loading step comprises a step of receiving said target substrate at a transfer position by said first support member, and a step of moving said target substrate down to said mount surface while supporting it by said first support member, said process position being arranged between said mount surface and said transfer position.

3. The method according to claim 1, wherein said loading step comprises a step of receiving said target substrate at a transfer position by a second support member movable up and down independently of said first support member, and a step of moving said target substrate down to said mount surface while supporting it by said second support member, said process position being arranged between said mount surface and said transfer position.

4. The method according to claim 1, wherein a temperature measuring terminal is arranged at a tip of at least one of said lifter pins, and said main processing step comprises a step of monitoring a temperature of said target substrate through said temperature measuring terminal.

5. The method according to claim 1, wherein said first gap has a thickness of not less than 5 mm.

6. The method according to claim 5, wherein said first gap has a thickness of from 0.5 mm to 2 mm.

7. The method according to claim 1, further comprising a purging step of displacing an inside of said process chamber by an inactive gas after said main processing step, said non-contact state being maintained during said purging step.

8. The method according to claim 1, wherein said main process is a process of forming a thin film on said target substrate.

9. The method according to claim 8, wherein a material of said thin film is presented by means of thermal dissociation of said process gas, and said thin film is formed by depositing said material on said target substrate.

10. The method according to claim 8, wherein a material to be thermally diffused into said target substrate of said thin film is presented by means of thermal dissociation of said process gas, and said thin film is formed by causing said material to react with a material of a surface layer of said target substrate.

11. A semiconductor processing apparatus comprising:

(a) a process chamber configured to house a target substrate;

(b) a worktable arranged in said process chamber and having a mount surface for mounting and heating said target substrate;

(c) a heating member configured to heat said mount surface;

(d) a separating mechanism configured to separate said target substrate and said mount surface from each other while keeping them parallel to each other and substantially entirely exposing said bottom surface of said target substrate, so as to transfer from a state where said bottom surface of said target substrate and said mount surface are in contact with each other to a non-contact state where said bottom surface of said target substrate and said mount surface face each other with a first gap therebetween;

(e) a gas supply system configured to supply a process gas into said process chamber; and (f) a control section configured to control said heating member, said separating mechanism, and said gas supply system, said control section being set to perform a contact heating step of heating said target substrate substantially to a process temperature by said mount surface, while maintaining a state where said bottom surface of said target substrate is in contact with said mount surface, a separating step, following said contact heating step, of separating said target substrate and said mount surface from each other while keeping them parallel to each other, so as to transfer to said non-contact state, said bottom surface of said target substrate being substantially entirely exposed to radiation heat from said mount surface to heat said target substrate in said separating step, a non-contact heating step of causing said bottom surface of said target substrate to be substantially entirely exposed to radiation heat from said mount surface in said non-contact state to heat said target substrate and keep said target substrate substantially at said process temperature, and a main processing step of supplying said process gas into said process chamber while performing said non-contact heating step, and subjecting said target substrate to a main process using said process gas, wherein said separating mechanism has a first support member, which is movable up and down, while said target substrate is mounted on said first support member such that said bottom surface is substantially entirely exposed, wherein said non-contact state is formed by moving said target substrate up to a process position by said first support member, and wherein said first support member comprises not less than three lifter pins, which are movable up and down between a state where they project from said mount surface and a state where they retreat under said mount surface.

12. The apparatus according to claim 11, wherein said first support member is operable to receive said target substrate at a transfer position, and move said target substrate down to said mount surface while supporting it, said process position being arranged between said mount surface and said transfer position.

13. The apparatus according to claim 11, further comprising a second support member movable up and down independently of said first support member, wherein said second support member is operable to receive said target substrate at a transfer position, and move said target substrate down to said mount surface while supporting it, said process position being arranged between said mount surface and said transfer position.

14. The apparatus according to claim 11, further comprising a temperature measuring terminal configured to monitor a temperature of said target substrate, arranged at a tip of at least one of said lifter pins.

* * * * *